(12) United States Patent
Ham (10) Patent No.: US 9,222,997 B2
(45) Date of Patent: Dec. 29, 2015

(54) GRADIENT COIL POWER SUPPLY AND A MAGNETIC RESONANCE IMAGING SYSTEM

(75) Inventor: Cornelis Leonardus Gerardus Ham, Oirschot (NL)

(73) Assignee: Koninklijke Philips N.V., Eindhoven (NL)

( * ) Notice: Subject to any disclaimer, the term of this patent is extended or adjusted under 35 U.S.C. 154(b) by 464 days.

(21) Appl. No.: 13/703,705

(22) PCT Filed: Jun. 14, 2011

(86) PCT No.: PCT/IB2011/052565
§ 371 (c)(1),
(2), (4) Date: Dec. 12, 2012

(87) PCT Pub. No.: WO2011/158170
PCT Pub. Date: Dec. 22, 2011

(65) Prior Publication Data
US 2013/0088234 A1 Apr. 11, 2013

(30) Foreign Application Priority Data
Jun. 17, 2010 (EP) .................................... 10166266

(51) Int. Cl.
*G01V 3/00* (2006.01)
*G01R 33/36* (2006.01)
(Continued)

(52) U.S. Cl.
CPC ............ *G01R 33/36* (2013.01); *G01R 33/3852* (2013.01); *H02M 7/49* (2013.01); *H03F 3/2178* (2013.01)

(58) Field of Classification Search
CPC .................................. G01R 33/3852

USPC .......................................... 324/322, 318, 314
See application file for complete search history.

(56) References Cited

U.S. PATENT DOCUMENTS 5,617,030 A * 4/1997 Fischer et al. ................. 324/322
5,663,647 A * 9/1997 Wirth et al. .................... 324/322
(Continued)

FOREIGN PATENT DOCUMENTS

EP 0987818 A2 3/2000
WO WO 2011083788 A1 * 7/2011

OTHER PUBLICATIONS

Li, S., et al.; Stacked High/Low Voltage Level H-Bridge Circuit for Gradient Amplifier of MRI System; 2008; Electrical Machines and Systems Int'l Conf; pp. 2154-2158.
(Continued)

Primary Examiner — Louis Arana (57) ABSTRACT

A gradient coil power supply includes: at least two H-bridge circuits connected in series, wherein each H-bridge circuit supplies: voltage of a first polarity when in a first switching state, voltage of a second polarity when in a second switching state, no voltage when in a third switching state, and no voltage when in a fourth switching state; and a controller for controlling the switching of the H-bridge circuits. The controller is adapted for: receiving a gradient pulse sequence; creating a switching plan for controlling the switching of the H-bridge circuits, wherein the switching plan includes controlling the voltage output of the gradient coil power supply by alternating between the first switching state and the second switching state, and at least one H-bridge circuit being in either the third or fourth switching state for part of the switching plan to cool the H-bridge circuit; and executing the switching plan.

14 Claims, 7 Drawing Sheets

(51) Int. Cl.
*G01R 33/385* (2006.01)
*H03F 3/217* (2006.01)
*H02M 7/49* (2007.01)

(56) References Cited

U.S. PATENT DOCUMENTS 6,166,602 A 12/2000 Steigerwald et al.
7,116,166 B2 * 10/2006 Sabate et al. .................. 330/146
7,253,625 B2 8/2007 Trabbic et al.

OTHER PUBLICATIONS

Sabate, J., et al.; High-Power High-Fidelity Switching Amplifier Driving Gradient Coils for MRI Systems; 2004; 35th Annual IEEE Power Electronics Specialists Conference; pp. 261-266.
Sabate, J., et al.; Parallel Operation of Switching Amplifiers Driving Magnetic Resonance Imaging Gradient Coils; 2004; Power Electronics and Motion Control Conference; pp. 1563-1567.

* cited by examiner

GRADIENT COIL POWER SUPPLY AND A MAGNETIC RESONANCE IMAGING SYSTEM

TECHNICAL FIELD

The invention relates to magnetic resonance imaging, in particular to power supplies for the magnetic field gradient coils of magnetic resonance imaging systems.

BACKGROUND OF THE INVENTION

In Magnetic Resonance Imaging (MRI), a gradient amplifier is typically used to provide current for three magnetic field gradient coils to provide 3-dimensional spatial encoding of atomic spins located in a magnetic field.

These gradient amplifiers are typically characterized by high peak power (several 100 kW up to 2 MW for present-day specimens) and high precision of the generated current waveforms. Circuits consisting of series-connected full bridges using pulse-width modulation (PWM) have been used to construct gradient amplifiers.

This circuit topology is known under several names, such as "stacked H-bridges", "cascaded H-bridges", or "cascaded multicell converter". The state of the art gradient amplifiers are switch-mode amplifiers, consisting of a series of H-bridges with solid state switches.

A fundamental circuit in power electronics is the canonical switching cell. The canonical switching cell is typically discussed using ideal switches. However a more practical implementation is using Insulated Gate Bipolar Transistors (IGBT) with anti-parallel diodes as switches.

The canonical switching cell is used to control the power flow and thereby the exchange of energy between two systems. Two switches are operated such that the load is connected to either the positive or negative terminal of a voltage source. The switches are operated in a manner such that exactly one of these is closed at any time. Closing both switches is prohibited as this would create a short circuit across the voltage source and thereby possibly cause unlimited current flow; opening both switches would obstruct the current from the current source on the right to flow, possibly causing unlimited voltage rise. Two trigger signals control the state of the two switches such that when a trigger signal is 1 the switched is closed, and when the trigger signal equals 0 then the switch is open. Due to the constraint discussed above the two trigger signals are logical inverses of each other. Note that this is a very general and conceptual circuit: depending on the polarity of the voltage V and of the current I the power flow can be in either direction.

The combination of two IGBT switches is defined as a phase leg; the origin of this name being that three of these circuits are necessary to build a three-phase voltage source inverter, which is presently the circuit of preference to drive medium power (ca. 100 W to 1 MW) induction motors.

The most common way a single phase leg is used is to control the power flow between the two attached systems is by using Pulse-Width Modulation (PWM). The simplest example of PWM is where two gate signals show a repetitive pattern in time. The first gate signal is turned on and conducting during an interval $\delta T_k$, and the second gate signal is turned on during the complementary interval $(1-\delta)T_k$, where $T_k$ denotes the repetition interval. The time interval $\delta T_k$ can also be expressed as a percentage of the time that a gate is turned on for one period of the PWM cycle.

For magnetic resonance imaging systems, H-bridges are switched at a fixed frequency of e.g. 20 kHz between a first and a second switching state. The time spent in each of the two switching states determines the time-averaged output voltage. The IGBT's are partly switching losses (e.g. 50%) and partly conducting losses (also 50%). The IGBT's are switched continuously. A minimum value of the switching frequency is needed to achieve a certain bandwidth.

In J. Sabatze et. al., "High-Power High-Fidelity Switching Amplifier Driving Gradient Coils for MRI Systems," 35th Annual IEEE Power Electronics Specialists Conference, 2004, pages 261-266 discloses a method of controlling the H-bridges in a gradient coil power supply to reduce switching losses. In this paper, two high voltage bridges supplied with 800V are not pulse modulated and only provide voltage when more than 400 V are needed. When not in use they remain in a freewheeling model with no output voltage.

SUMMARY OF THE INVENTION

The invention provides for a gradient coil power supply, a method of operating a gradient coil power supply, a computer program product, and a magnetic resonance imaging system in the independent claims. Embodiments are given in the dependent claims.

A limit to how much power or how much RMS current an H-bridge circuit can supply as part of gradient coil power supply is determined by the amount of heat it can dissipate. Switching the H-bridges at a fixed rate leads to fixed switching losses in the H-bridge circuit. Even if the H-Bridge circuit is only supplying a low, time-averaged voltage the switching losses will be identical to when the H-bridge is providing a time-averaged voltage close to its maximum. A technical problem is therefore to increase the RMS current supplied by the H-bridge or gradient coil power supply.

Embodiments of the invention may enable the reduction of switching losses in the gradient amplifier and/or exchange switching losses for conductive dissipation. In some embodiments this may be achieved by altering the method of switching of the H-bridges. In some embodiments, the H-bridge circuits are normally operated by switching between a first and second switching mode. This corresponds to the normal pulse width modulation method of operating an H-bridge circuit. However the H-bridges may also be switched into an alternative operating mode where the voltage source of the H-bridge only conducts current and does not provide a voltage. The H-bridge circuit can be left in this state to cool. If this is done with various H-bridge circuits in a gradient coil power supply the overall operating temperature of the H-bridge circuits can be reduced. This allows for an increased RMS current to be supplied by the gradient coil power supply.

Magnetic Resonance Image (MRI) data is defined herein as being the recorded measurements of radio frequency signals emitted by atomic spins by the antenna of a Magnetic resonance apparatus during a magnetic resonance imaging scan. A Magnetic Resonance Imaging (MRI) image is defined herein as being the reconstructed two or three dimensional visualization of anatomic data contained within the magnetic resonance data. This visualization can be performed using a computer.

A computer-readable storage medium as used herein is any storage medium which may store instructions which are executable by a processor of a computing device. The computer-readable storage medium may be a computer-readable non-transitory storage medium. The computer-readable storage medium may also be a tangible computer readable medium. In some embodiments, a computer-readable storage medium may also be able to store data which is able to be accessed by the processor of the computing device. An example of a computer-readable storage medium include, but are not limited to: a floppy disk, a magnetic hard disk drive, a solid state hard disk, flash memory, a USB thumb drive, Random Access Memory (RAM) memory, Read Only Memory (ROM) memory, an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network.

Computer memory is an example of a computer-readable storage medium. Computer memory is any memory which is directly accessible to a processor. Examples of computer memory include, but are not limited to: RAM memory, registers, and register files.

Computer storage is an example of a computer-readable storage medium. Computer storage is any non-volatile computer-readable storage medium. Examples of computer storage include, but are not limited to: a hard disk drive, a USB thumb drive, a floppy drive, a smart card, a DVD, a CD-ROM, and a solid state hard drive. In some embodiments computer storage may also be computer memory or vice versa.

A 'processor' as used herein encompasses an electronic component which is able to execute a program or machine executable instruction. References to 'a processor' should be interpreted as possibly containing more than one processor. The term processor should also be interpreted to possibly refer to a collection or network of computing devices each comprising a processor. Many programs have their instructions performed by multiple processors that may be within the same computing device or which may even distributed across multiple computing device.

An 'H-bridge' as used herein encompasses an electric circuit with a voltage supply and four switching elements which are used to connect the voltage supply with the outputs of the H-bridge circuit. The switching elements allow the polarity of the voltage the output by the H-bridge circuit to be switched.

In one aspect the invention provides for a gradient coil power supply for a magnetic resonance imaging system. A gradient coil power supply is a power supply adapted for providing voltage to the coils of a magnetic resonance imaging gradient coil. In making reference to the coil of a magnetic resonance imaging gradient coil it is understood that the coil actually comprises multiple coils. Typically three sets of coils are used to produce a magnet field gradient in three directions. Often these directions are orthogonal to each other.

The gradient coil power supply comprises at least two H-bridge circuits. The H-bridge circuits are connected in series. Each H-bridge circuit supplies voltage of a first polarity when in a first switching state. Each H-bridge circuit supplies voltage of a second polarity when the H-bridge is in a second switching state. Each H-bridge circuit supplies no voltage when in a third switching state. Each H-bridge circuit supplies no voltage when in a fourth switching state. The H-bridge circuit is able to conduct current when in the third and fourth switching states.

H-bridge circuits comprise a voltage source and four switching elements which allow the voltage source to be connected to outputs of the H-bridge circuit either forward or reversed biased. Essentially H-bridge circuits are used to connect the voltage source in a forward or reversed bias fashion. The magnetic field generated by the magnetic resonance imaging gradient coil is dependent on the current flowing through the gradient coil. By switching the H-bridge circuits between the various states the current through the gradient coil may be controlled. This has the effect of controlling the magnetic field generated by the gradient coil.

The gradient coil power supply further comprises a controller for controlling the switching of the H-bridge circuits. Essentially the controller controls which of the four states each H-bridge circuit is in. The controller is adapted for receiving a gradient pulse sequence. A gradient pulse sequence as used herein is a time dependent plan energizing the magnetic resonance imaging gradient coil. For instance a gradient pulse sequence could be a specified current flowing through the gradient coils as a function of time. Similarly, the gradient pulse sequence could also be written in terms of the magnetic field generated by the magnetic resonance imaging gradient coils. The controller is further adapted for creating a switching plan for controlling the switching of the switching units in each of the H-bridge circuits. Essentially the switching plan is a plan for controlling which of the four switching states each H-bridge circuit is in as a function of time.

In some embodiments the controller may comprise a receiving means for receiving the gradient pulse sequence. In some embodiments the controller may comprise a switching plan creation means for creating a switching plan for controlling the switching of each of the H-bridge circuits.

The switching plan comprises instructions for controlling the output of the gradient coil power supply by alternating between the first switching state and the second switching state. The switching plan further comprises operating at least one H-bridge circuit selected by the H-bridge circuits in either the third or fourth switching state for part of the switching plan to cool the H-bridge circuit. During normal operation the H-bridge circuits are switched between the first and second states. This allows the controlling of the current supplied to the gradient coils by the gradient coil power supply.

The H-bridge circuits have two types of loss mechanisms during operation. The first is conduction losses. These are losses similar to normal Ohmic losses when current passes through the switching elements of each of the H-bridge circuits. Also when a switching element is changed from one state to the other there are additional losses. By placing an H-bridge circuit into either the third or fourth state for a predetermined amount of time current is simply conducted through the H-bridge circuit which is in the third or fourth state and there are no additional switching losses. This is advantageous because the H-bridge circuits may be cooled effectively.

In another embodiment the switching plan further comprises switching the H-bridge circuit at a varied frequency between the first and second switching states. In this embodiment the waveform which is produced by the H-bridge circuit is varied. This is advantageous because the switching frequency of the H-bridge circuits may be adapted to a waveform requirement. For some pulse sequences, the actual waveform of the pulse sequence is not critical but the integral of the current is. For instance by switching the H-bridge circuit at a varied frequency the frequency may be lowered to maintain the integral of the current. This allows operating the H-bridge circuit at a lower frequency and also allows the H-bridge circuit to be cooler. This may allow the supplying of additional current by the H-bridge circuit.

The embodiment where the switching plan further comprises switching the H-bridge circuit at a varied frequency between the first and second switching states may also be performed as a separate method. That is to say that this method may be performed without operating at least one H-bridge circuit selected from the H-bridge circuits in either the third of fourth switching state for part of the switching plan to cool the H-bridge circuit. Performing the embodiment where the switching plan further comprises switching the H-bridge circuit at a varied frequency between the first and second switching states is beneficial to perform by its self, because this reduces the switching losses in the individual H-bridge circuits.

In another embodiment the controller is further adapted for varying the frequency to minimize the switching losses in the H-bridge circuit and increase the maximum mean square current able to be conducted by the H-bridge circuit. Essentially the switching losses may be reduced by decreasing the frequency in which an H-bridge circuit is switched. If the controller is able to receive a gradient pulse sequence and then modify it so it has the same effect during the magnetic resonance imaging however but at a slower switching rate, then the switching losses will be reduced. This may allow the H-bridge circuits to supply more power before they become overheated. In some embodiments the controller may comprise a frequency varying means for varying the frequency to minimize the switching losses in the H-bridge circuit.

The embodiment where the controller is further adapted for varying the frequency to minimize the switching losses in the H-bridge circuit and increase the maximum mean square current able to be conducted by the H-bridge circuit may also be performed as a separate method. That is to say that this method may be performed without operating at least one H-bridge circuit selected from the H-bridge circuits in either the third of fourth switching state for part of the switching plan to cool the H-bridge circuit. Performing the embodiment where the controller is further adapted for varying the frequency to minimize the switching losses in the H-bridge circuit and increase the maximum mean square current able to be conducted by the H-bridge circuit is beneficial to perform by its self, because this reduces the switching losses in the individual H-bridge circuits.

In another embodiment the controller is further adapted for determining a minimum bandwidth for the gradient pulse sequence. The switching plan further comprises adjusting the varied frequency above a minimum threshold. The minimum threshold is the minimum frequency to obtain the minimum bandwidth. In this embodiment the minimum bandwidth is the bandwidth which is necessary for the pulse sequence to have an equivalent effect on the magnetic spins. The effect of limiting the bandwidth is equivalent to decomposing the gradient pulse sequence into Fourier components and then removing those components above a cut off frequency. This of course affects the wave form and causes sharp transitions to become more gradual. However, if the cut off frequency is sufficiently high then this will not have an effect for many gradient pulse sequences. In some embodiments the controller may comprise a bandwidth determination means for determining a minimum bandwidth for the gradient pulse sequence.

The embodiment where the controller is further adapted for determining a minimum bandwidth for the gradient pulse sequence may also be performed as a separate method. That is to say that this method may be performed without operating at least one H-bridge circuit selected from the H-bridge circuits in either the third of fourth switching state for part of the switching plan to cool the H-bridge circuit. Performing the embodiment where the controller is further adapted for determining a minimum bandwidth for the gradient pulse sequence is beneficial to perform by its self, because this reduces the switching losses in the individual H-bridge circuits.

In another embodiment the pulse sequence specifies a time dependent current with a trapezoidal shape. The trapezoidal shape specifies a time period where a constant current is specified. For instance a current may ramp up and be maintained at a plateau and then decrease again as a function of time. The constant current may be equated with the plateau. The switching plan further comprises reducing the varied frequency during the time period. This is advantageous because the voltage and current through the gradient coils is not changing during the time period when the constant current is specified. This embodiment has the advantage that the varied frequency is reduced. This reduces the switching losses and allows the H-bridges to cool.

Some observations on gradient coil pulse sequences:

Almost all waveforms in MR are based on trapezoids.

Most important requirement for most of the trapezoids is the accuracy and reproducibility of the gradient area. The exact shape is less an issue.

The shape of readout gradients is important.

During the flat part of a trapezoid the amplifier only needs to deliver a low voltage.

Many slopes are at the maximum slew rate, which corresponds with the maximum voltage of the amplifier.

In this embodiment, the idea is to reduce the switching losses in order to allow higher conducting losses, i.e. to increase the (RMS) current. This can be performed for certain parts of the gradient waveforms. This can be implemented by having an amplifier with various mode of operation, to be controlled by a controller.

The embodiment where the pulse sequence specifies a time dependent current with a trapezoidal shape may also be performed as a separate method. That is to say that this method may be performed without operating at least one H-bridge circuit selected from the H-bridge circuits in either the third of fourth switching state for part of the switching plan to cool the H-bridge circuit. Performing the embodiment where the pulse sequence specifies a time dependent current with a trapezoidal shape is beneficial to perform by its self, because this reduces the switching losses in the individual H-bridge circuits.

In another embodiment the switching plan further comprises fixing the H-bridge circuit in the first or second switching state for a period of time. H-bridge circuits currently used in the art are switched between the first and second states. Typically a duty cycle is specified. This duty cycle has a certain minimum or maximum. In contrast in this embodiment a particular H-bridge circuit is fixed in the first or second switching state for a period of time. The H-bridge circuit can then supply voltage constantly and not have switching losses. This also means that the H-bridge circuits are able to supply a larger range of voltages. This is because a portion of the voltage is lost due to the minimum or maximum duty cycle of H-bridge circuits in the current state of the art.

The switching plan further comprises setting one to as many as all but one of the H-bridge circuits to either the first or second switching state for a fixed period of time. The remaining H-bridge circuits may be switched at a varied frequency. The switching plan further comprises switching the remaining H-bridge circuit at a varied frequency between the first and second switching states. The fixed period of time is longer than the period of the varied frequency. This embodiment has the advantage of allowing a larger voltage range than when all of the H-bridge circuits are switched. This is due to the previously mentioned maximum and/or minimum duty cycle.

The embodiment where the switching plan further comprises fixing the H-bridge circuit in the first or second switching state for a period of time may also be performed as a separate method. That is to say that this method may be performed without operating at least one H-bridge circuit selected from the H-bridge circuits in either the third of fourth switching state for part of the switching plan to cool the H-bridge circuit. Performing the embodiment where the switching plan further comprises fixing the H-bridge circuit in the first or second switching state for a period of time is beneficial to perform by its self, because this reduces the switching losses in the individual H-bridge circuits.

In another embodiment the first, second, third and fourth switching units are IGBT switching units.

In another embodiment each H-bridge comprises a voltage supply. Each H-bridge also comprises a first switching unit, a second switching unit, a third switching unit, and a fourth switching unit. Either solid state or mechanical switching units could be used. However, typically solid state or transistor based switching units are used. When an H-bridge is in the first switching state the first and fourth switching units are closed and the second and third switching units are open. When an H-bridge is in the second switching state the second and third switching units are closed and the second and third switching units are open. When the H-bridge circuit is in the third switching state the third and fourth switching units are open and the first and second switching units are closed. When the H-bridge circuit is in the fourth switching state the third and fourth switching units are closed and the first and second switching units are open.

In another embodiment each of the H-bridge circuits has a first and second output. Each switching unit has a first connection and a second connection. The first connection of an H-bridge of the first switching unit is connected to the first output of the H-bridge circuit. The second connection of the first switching unit is connected to the first connection of the second switching unit. The second connection of the second switching unit is connected to the second output of the H-bridge circuit. The first connection of the third switching unit is connected to the first output of the H-bridge circuit. The second connection of the third switching unit is connected to the first connection of the fourth switching unit. The second connection of the fourth switching unit is connected to the second output. Each voltage supply comprises a first voltage output and a second voltage output. The first voltage output is connected to the second connection of the first switching unit. The second voltage output is connected to the second output of the third switching unit.

In another aspect the invention provides for a method of operating a gradient coil power supply for a magnetic resonance imaging system. The gradient coil power supply comprises at least two H-bridge circuits. The H-bridge circuits are connected in series. Each H-bridge circuit supplies voltage of a first polarity when in a first switching state wherein each H-bridge circuit supplies voltage of a second polarity when the H-bridge is in a second switching state. Each H-bridge circuit supplies no voltage when in a third switching state. Each H-bridge circuit supplies no voltage when in a fourth switching state. The method comprises the step of receiving a gradient pulse sequence.

The method further comprises the step of creating a switching plan for controlling the switching of the switching units in each of the H-bridge circuits. The switching plan comprises controlling the voltage output of the gradient coil power supply by alternating between the first switching state and the second switching state. The switching plan further comprises operating at least one H-bridge circuit selected from the H-bridge circuits in either the third or fourth switching states for part of the switching plan to cool the H-bridge circuit. The method further comprises the step of executing the switching plan. The advantages of this have been previously discussed.

In another embodiment the switching plan further comprises switching the H-bridge circuit at a varied frequency between the first and second switching states.

In another aspect the invention provides for a computer program product comprising machine executable instructions for execution by a processor of a control unit of a gradient coil power supply for a magnetic resonance imaging system. The computer program product could for instance be instructions stored on a computer-readable storage medium. The gradient coil power supply comprises at least two H-bridge circuits. The H-bridge circuits are connected in series. Each H-bridge circuit supplies voltage of a first polarity when in a first switching state, wherein the H-bridge circuit supplies voltage of a second polarity when the H-bridge is in the second switching state. Each H-bridge circuit supplies no voltage when in a third switching state. Each H-bridge circuit supplies no voltage when in a fourth switching state. It should be noted though that in the third and fourth switching states the H-bridge circuit is able to conduct current. That is to say that the third and fourth switching states are not open. The machine executable instructions cause the processor to perform the step of receiving a gradient pulse sequence.

The machine executable instructions further cause the processor to perform the step of creating a switching plan for controlling the switching of the switching units in each of the H-bridge circuits. The switching plan comprises controlling the voltage output of the gradient coil power supply by alternating between the first switching state and the second switching state. The switching plan further comprises operating at least one H-bridge circuit selected from the H-bridge circuits in either the third or fourth switching state for part of the switching plan to cool the H-bridge circuit. The machine executable instructions further cause the processor to perform the step of executing the switching plan. The advantages of this have been previously discussed.

In another aspect the invention provides for a magnetic resonance imaging system. The magnetic resonance imaging system comprises a magnetic resonance imaging magnet. The magnetic resonance imaging magnet is used to align the spins of polarizable nuclei within an imaging zone of the magnet. The magnetic resonance imaging system further comprises a radio frequency system for acquiring magnetic resonance data. The radio frequency system is adapted to connect to a radio frequency antenna. In some embodiments the radio frequency system may comprise a radio frequency antenna connection means for connecting to a radio frequency antenna. The radio frequency system uses radio frequency transmissions for manipulating the orientation of the magnetic spins within the imaging zone. The radio frequency system also measures radio emissions by the same nuclei as a means of acquiring the magnetic resonance data. The magnetic resonance imaging system further comprises a gradient coil power supply according to an embodiment of the invention. The magnetic field gradient coil power supply is adapted for supplying current to the magnetic field gradient coil. The magnetic resonance imaging system further comprises a magnetic field gradient coil. The magnetic resonance imaging system further comprises a computer system adapted for constructing images from magnetic resonance data and for controlling the operation of the magnetic resonance imaging system. The computer system is adapted for generating magnetic resonance images of a subject using the magnetic resonance data.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
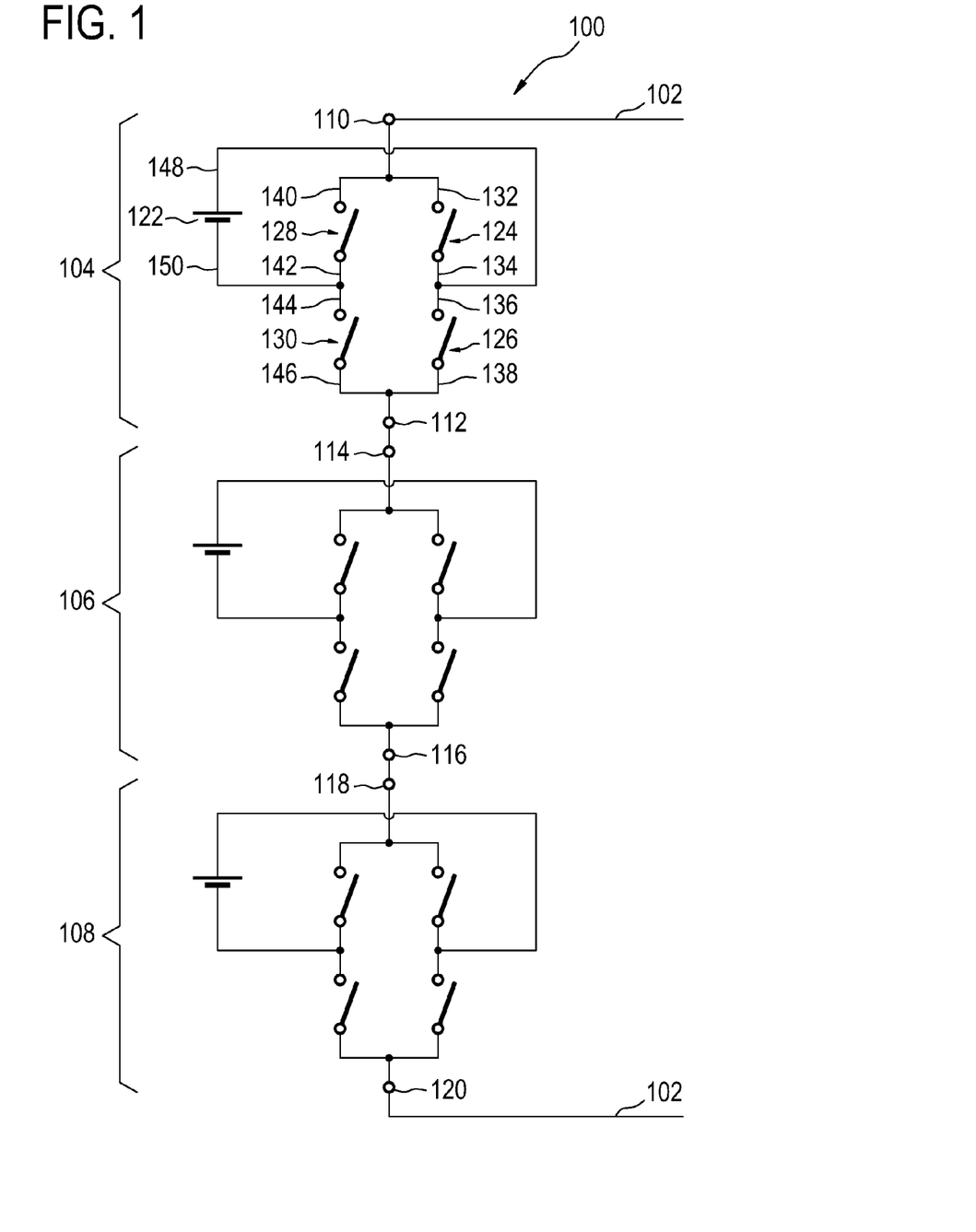
FIG. 1 shows a schematic diagram of a gradient coil power supply.

FIG. 1 shows a schematic diagram of a gradient coil power supply 100 according to an embodiment of the invention. In the embodiment shown in FIG. 1 circuitry for performing the control of the H-bridge circuits is not shown. Similarly only a single voltage supply is shown. For a magnetic resonance imaging system, typically there will be one voltage supply for three different orthogonal directions. The gradient coil power supply is shown as having two outputs or a connection 102 to a gradient coil. Between the connections to the gradient coil 102 are three H-bridge circuits 104, 106, 108. There is a first H-bridge circuit 104, a second H-bridge circuit 106, and a third H-bridge circuit 108. Each of the H-bridge circuits 104, 106, 108 has a first output 110, 114, 118 and a second output 112, 116, 120. The three H-bridge circuits 104, 106, 108 are shown as being connected in series. The first output of the first H-bridge circuit 110 is connected to one of the connections 102 to the gradient coil. The second output of the first H-bridge circuit 112 is connected to the first output of the second H-bridge circuit 114. The second output of the second H-bridge circuit 116 is connected to the first output of the third H-bridge circuit 118. The second output of the third H-bridge circuit 120 is connected to the other connection 102 to the gradient coil.

The components of the first H-bridge circuit 104 are labeled. The first H-bridge circuit 104 comprises a voltage supply 122, a first switching unit 124, a second switching unit 126, a third switching unit 128 and a fourth switching unit 130. The voltage supply 122 and each of the switching units 124, 126, 128, 130 each have first and second connections. The first connection 132 of the first switching unit is connected to the first output 110 of the first H-bridge circuit 104. The second connection 134 of the first switching unit 124 is connected to the first connection 136 of the second switching unit 126. The second connection 138 of the second switching unit 126 is connected to the second output 112 of the first H-bridge circuit 104. The first connection 140 of the third switching unit 128 is connected to the first output 110 of the first H-bridge circuit 104. The second connection 142 of the third switching unit 128 is connected to the first connection 144 of the fourth switching unit 130. The second connection 146 of the fourth switching unit 130 is connected to the second output 112 of the first H-bridge circuit 104. The first output 148 of the voltage supply 122 is connected to the second connection 134 of the first switching unit 124. The second output 150 of the voltage source 122 is connected to the second connection 142 of the third switching unit 128. It can be seen in this circuit diagram that the switching units 124, 126, 128, 130 allow the voltage source 122 to be connected to the first and second outputs 110, 114 of the first H-bridge circuit 104 with either polarity. The switching units 124, 126, 128, 130 can also be used to short circuit the first and second outputs 110, 112 of the first H-bridge circuit 104. The second 106 and third 108 H-bridge circuits have components which are analogous to those of the first H-bridge circuit 104. The embodiments of the invention are applicable when there are two or more H-bridge circuits. The embodiment in FIG. 1 shows three H-bridge circuits 104, 106, 108. However the invention is not limited to the case of just three H-bridge circuits. The invention is applicable to both smaller and larger chains of H-bridge circuits connected in series.

Figure 2:
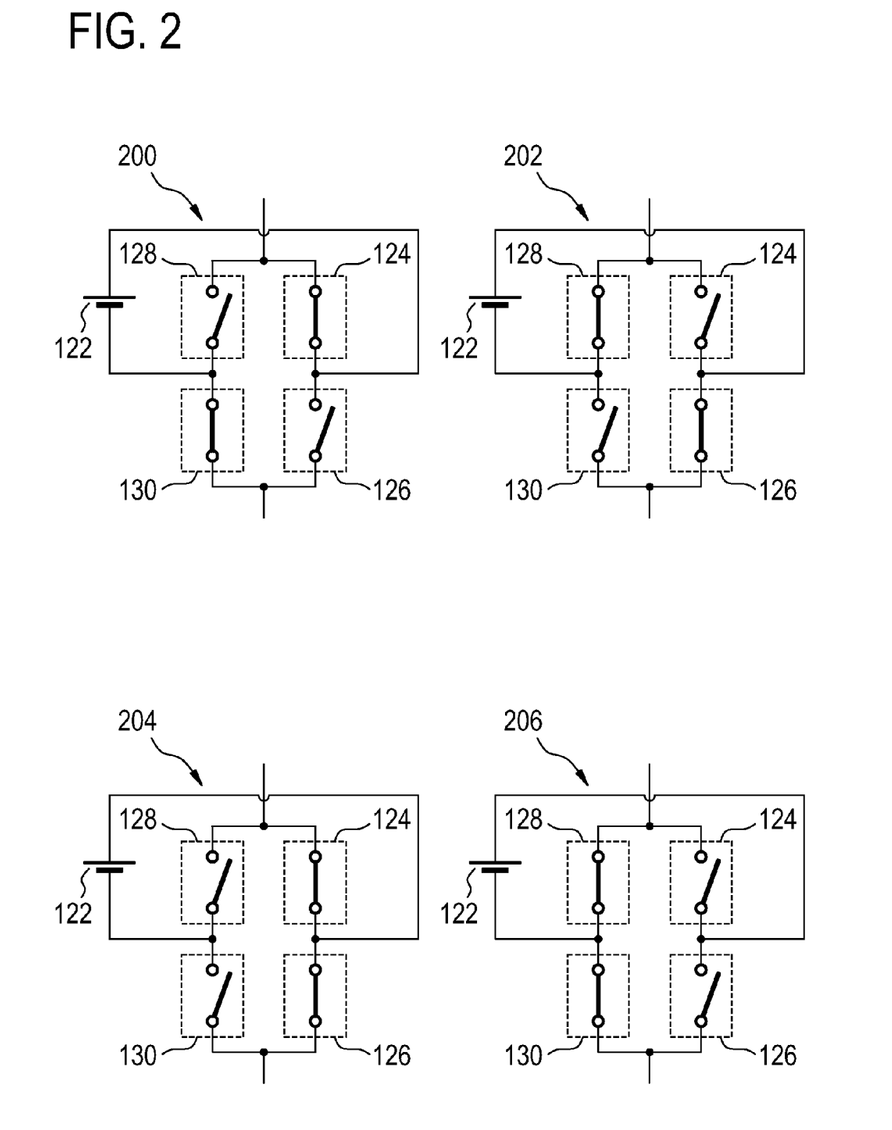
FIG. 2 shows a schematic diagram of H-bridge circuits in different switching states.

FIG. 2 shows a schematic diagram of H-bridge circuits in different switching states; a first switching state 200; a second switching state 202; a third switching state 204; and a fourth switching state 205. For first switching state 200 it can be seen that the first switching unit 124 and the fourth switching unit 130 are closed and the second 126 and the third 128 switching units are open. It can be seen that for the second switching state 202 the first 124 and fourth 130 switching units are open. The second 126 and third 128 switching units are closed. For the switching states labeled 200 and 202 it can be seen that the voltage supply 122 is connected to the outputs of the H-bridge circuit. However the polarity of the voltage output by the H-bridge circuit in switching states 200, 202 is reversed with respect to each other.

For the switching states 204 and 206 the voltage supply 122 is disconnected from the output of the H-bridge circuit. For example in the third switching state 204 the first and second switching units 124, 126 are closed. The third and fourth switching units 128, 130 are open. This has the effect of disconnecting the voltage source 122. Similarly for the H-bridge circuit in the fourth switching state 206 the third and fourth switching units 128, 130 are closed and the first 124 and second 126 switching units are open. This also has the effect of disconnecting the voltage source 122 from the outputs of the H-bridge circuit.

The switches can be used in two different states which do not connect the voltage source 122 to the outputs of the H-bridge circuit: the third switching state 204 with switches 124 and 126 closed (and switches 128 and 130 open) and the fourth switching state 206 with switches 128 and 130 closed (and switches 124 and 126 open). In either of these two switching states 204, 206 the H-bridge does not deliver voltage. It only allows passing the current. The H-bridge can switch between these modes at a fairly low frequency, or be set in one switch state for a gradient trapezoid and in another switch state for a next trapezoid. Switching a particular H-bridge between the third switching state 204 and the fourth switching state allows the spreading of heat between all switches.

The third switching state 204 and the fourth switching state 206 correspond to a "no voltage" state of the H-bridge. The first switching state 200 and the second switching state 202 correspond to a "voltage" state of the H-bridge. When an H-bridge is fixed in a "no voltage" state there are no switching losses. In case of an amplifier with three bridges, two of them can be in the "no voltage" state, while the third on is in the "voltage" state. The bridge that is at the "voltage" state can be cyclic-permutated.

Figure 3:
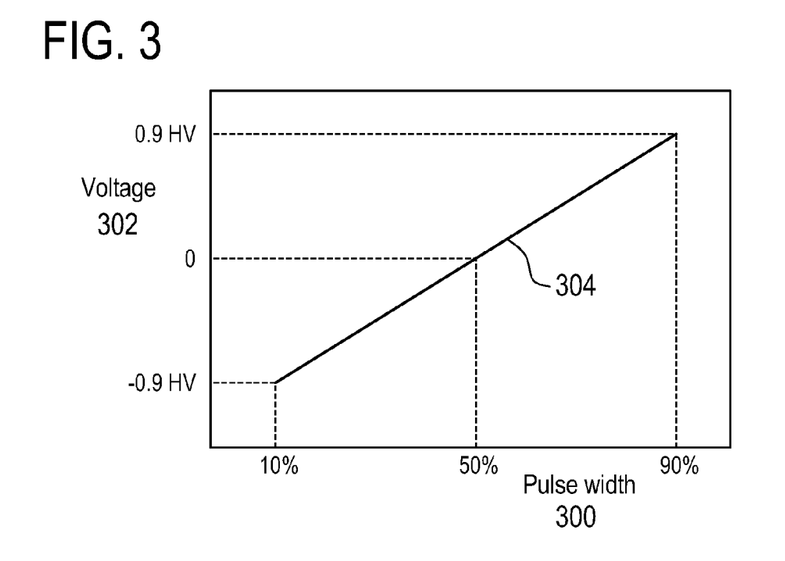
FIG. 3 shows a graph of the pulse width versus the voltage output of an H-bridge circuit.

FIG. 3 shows a graph of the pulse width 300 versus the voltage output 302 of an H-bridge circuit. The H-bridge circuit is switched between the first switching state 200 and the second switching state 202. The pulse width 300 is given as a percentage of the duty cycle spent in first switching state 200. "HV" for the labels in the in the voltage axis indicates the voltage output of the voltage source of the H-bridge. For example 0.9 HV is 90% of the voltage of the H-bridge circuit. The voltage 302 is the time average voltage output by the H-bridge circuit. It can be seen in FIG. 3 that if the pulse width is limited to between 10 and 90% then the voltage can only range between −0.9 HV and 0.9 HV.

FIG. 3 illustrates how the voltage output of an H-bridge circuit is limited when the H-bridge circuit is oscillating between the first and second switching states. If the H-bridge circuit can be locked into either the first or second switching state then the voltage can range between −1 and 1 HV.

Figure 4:
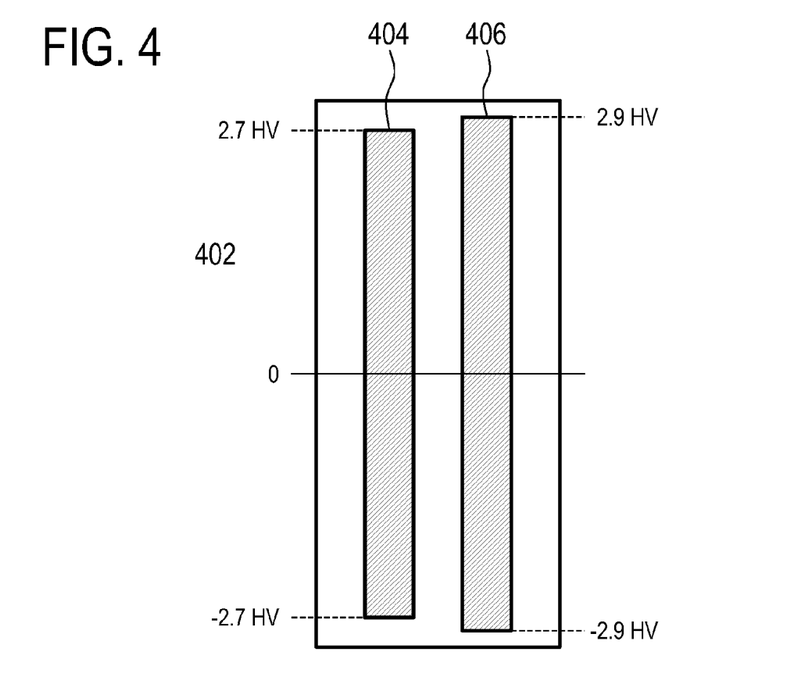
FIG. 4 shows a diagram which illustrates how the maximum voltage can be increased by locking one or more of the H-bridges into the first or second state.

FIG. 4 shows a diagram which illustrates how the maximum voltage can be increased by locking one or more of the H-bridges into the first or second state. In FIG. 4 the access labeled 402 shows the voltage range or time average voltage range which is able to be produced by a chain of three H-bridge circuits in series. For this example it is assumed that H-bridge circuits need to be operated with a pulse width or duty cycle that ranges between 10 and 90%. The bar labeled 404 shows the ranges of time average voltage 402 which can be produced by three H-bridge circuits which are oscillating between the first and second states. The second bar 406 shows the voltage range which is achievable when one or two of the H-bridge circuits can be locked into the first or second state. In this example we see that bar 404 ranges between −0.27 HV and 2.7 HV. For bar 406 the voltage ranges between −2.9 HV and 2.9 HV. As a result we can see that the locking of one or two of the H-bridge circuits into the first or second state allows a larger voltage range. Also when the H-bridge circuits are locked into a particular state there are no switching losses. This means that there is less energy loss and also less heating in the switching unit.

Many slopes are close to the maximum voltage. In that case 2 of the 3 bridges can be set in one of the first or second switching states. The 3rd bridge is 'switching' with a certain pulse width to deliver a voltage in between 0.9 HV and 0.9 HV. The bridges which are fixed in a "voltage" state don't have switching losses.

As an example: the first H-bridges may be fixed in a particular "voltage" state, that is the first switching state 200 or the second switching state 202 of FIG. 2. The second H-bridge may be set into a "no-voltage" mode, that is the third switching state 204 and the fourth switching state 206 of FIG. 2. The third H-bridge circuit may be switched with a defined pulse width between the first switching state 200 and the second switching state 202. The 'switching with a certain pulse width, the three bridges are capable of producing a voltage between −1.9 HV and 1.9 HV, with low switching losses. The maximum RMS current which can be supplied by this circuit can be increased by cyclically alternating which of H-bridge circuits are fixed in the "voltage" state, the "no-voltage" state, and which is switched between the first switching state 200 and the second switching state 202. The RMS current can be increased because the H-bridges are alternatively heated and cooled which leads to a lower operating temperature. When a H-bridge circuit is in the "no-voltage" state, the H-bridge can be further switched between the third 204 and the fourth 206 switching states. An advantage of this approach is that the total voltage is higher. Two bridges produce a voltage HV and the 3rd one has a maximum voltage of 0.9 HV. Total voltage is 2.9 HV. In the 'state-of-the-art' case, where all bridges are switching, the maximum output voltage is 2.7 HV.

Figure 5:
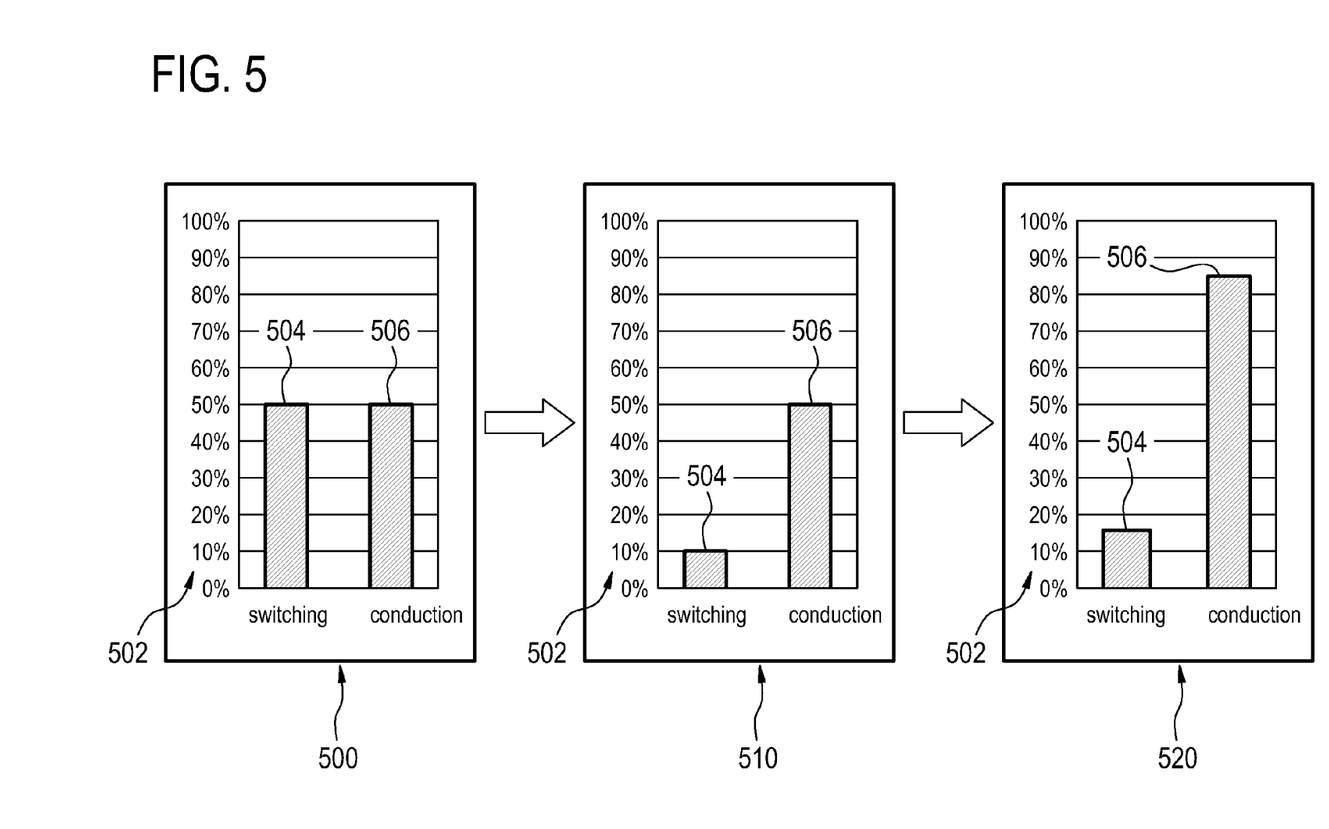
FIG. 5 illustrates the benefit of operating H-bridges at a lower switching frequency.

FIG. 5 illustrates the benefit of operating H-bridges at a lower switching frequency. FIG. 5 shows three graphs 500, 510, 520. In each of these three graphs the y-axis is labeled 502. The y-axis 502 shows the percentage of energy loss due to switching 504 losses and conduction 506 losses. For solid state H-bridge circuits there is a maximum thermal rating. A maximum loss of 100% would represent a loss which generates the maximum amount of heat allowed for a solid state switching unit of an H-bridge circuit to function properly. In this example FIG. 500 shows an example where the losses due to switching 504 and conduction 506 are equal. In an embodiment of the invention the switching rate is reduced. This has the effect of making the current generated in the gradient coil follow the gradient pulse sequence less accurately but in many situations the pulse sequence for the gradient coil still functions properly. In FIG. 510 the switching rate is reduced so the switching losses are reduced from 50% to 10%. In the example shown in FIG. 510 it means that the power loss is 60% of the maximum possible power loss. This means that the maximum current which can be conducted by the H-bridge circuit may be increased. In FIG. 520 we can see that the current is increased so that the conduction losses increase to 85% and the switching losses are increased to 15%. This illustrates the benefit of operating the H-bridge circuits at a reduced frequency. The effect of reducing the H-bridge circuit at a lower frequency has the effect of removing higher harmonics from the gradient current waveform which is generated. For many commercial gradient coil power supplies they are switched at a frequency of 25 kHz. The switching losses are directly proportional to the rate at which the switching is performed. For example if the switching frequency is reduced to 10 kHz from 25 kHz the switching losses would be reduced to 40% of what they were previously.

The main requirement for diffusion gradients is a fixed gradient area. There are no high requirements on the accuracy/flatness/etc of the waveform. This is also the case for e.g. phase encoding gradients, crusher gradients.

This means that the amplifier does not need to deliver a high bandwidth during these phases of a scan, which allows a low switching frequency. Some of the H-bridges can even be switched in an idle state. An idle state is where the H-bridge is not actively switched, that is the H-bridge is fixed in a "voltage" or "no-voltage" state.

Figure 6:
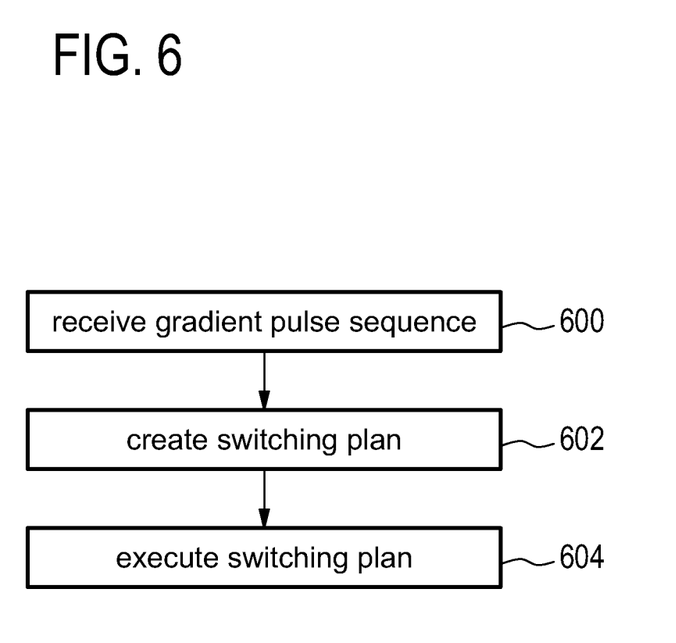
FIG. 6; shows a block diagram which illustrates a method according to an embodiment of the invention.

FIG. 6 shows a block diagram which illustrates a method according to an embodiment of the invention. This method could be used to program a controller or a computer. For example to create a computer-readable storage medium which contain instructions for performing this method. In step 600 a gradient pulse sequence is received. In step 602 a switching plan is created. A switching plan is a plan for operating the various switching units of the H-bridge circuits which comprise the gradient coil power supply. In step 604 the switching plan is executed.

The controller can also be located in the gradient coil power supply. When this controller receives a requested waveform with a particular waveform, it can execute an 'on the fly' switching plan to approximate the waveform.

Figure 7:
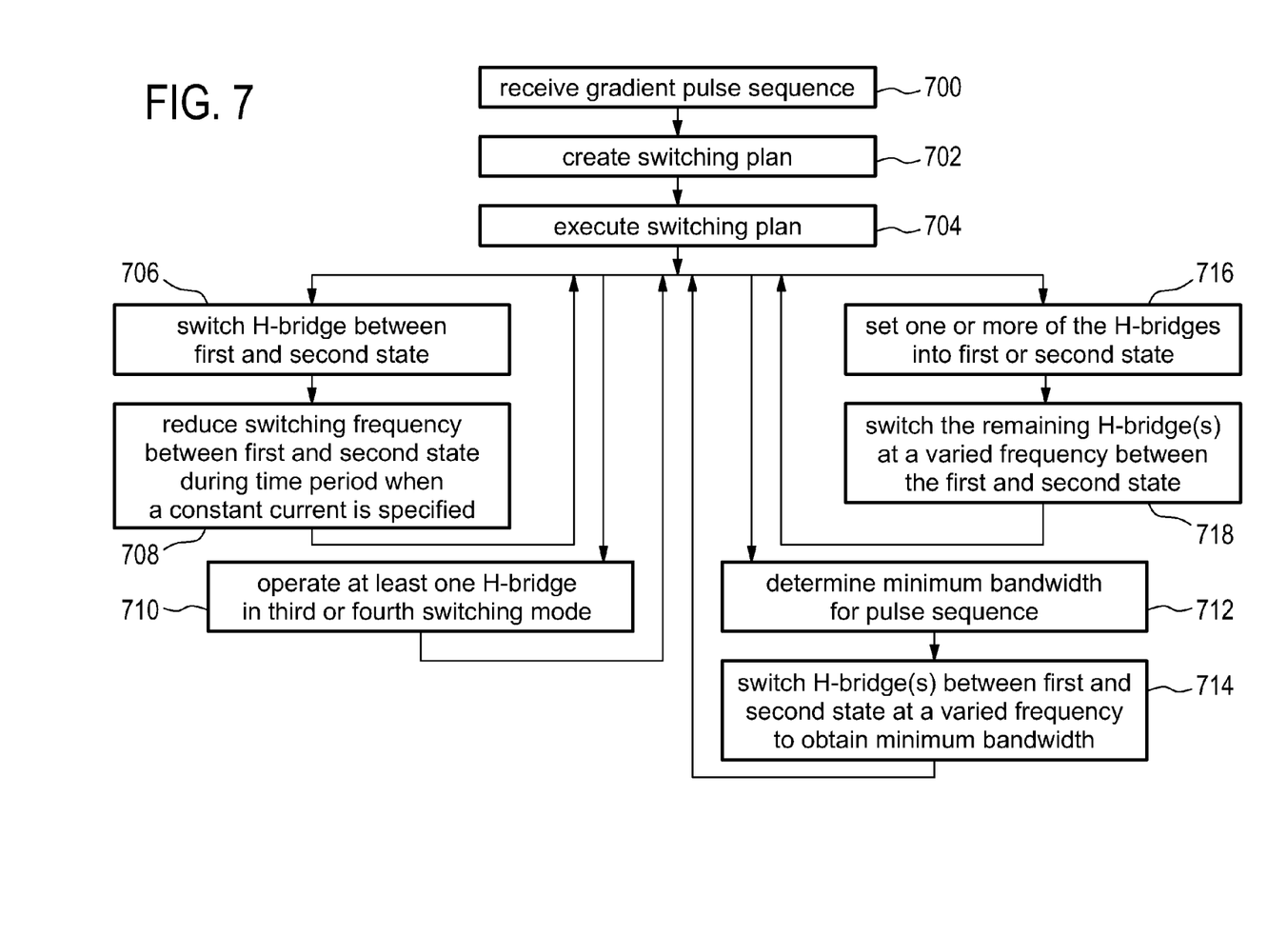
FIG. 7 shows a block diagram which illustrates a further method according to an embodiment of the invention.

FIG. 7 shows a block diagram which illustrates a further embodiment of a method according to an embodiment of the invention. Likewise with FIG. 7 the method could be implemented by a controller or it could also be implemented as a computer program product or a computer-readable storage medium. In step 700 a gradient pulse sequence is received. In step 702 a switching plan is created. In step 704 the switching plan is executed. After the switching plan is executed a variety of blocks show various actions that can be performed during execution of the method. The H-bridge circuits can be switched between various modes of operation. For example in step 706 an H-bridge is switched between the first and second states. During part of the switching plan the switching frequency 708 is reduced between the first and second states during the time period when a constant current is specified.

During a particular switching plan a variety of different actions could be performed by one or more of the H-bridge circuits. For instance in step 710 at least one H-bridge is operated in the third or fourth switching mode. Another mode of operation which is possible during the execution of a switching plan 702 is during the creation of the switching plan the minimum bandwidth 712 for pulse sequences is determined. Then in step 714 the H-bridges are switched between a first and second state at a varied frequency to obtain the minimum bandwidth. In step 716 a different set of operations is illustrated. In step 716 all but one of the H-bridge circuits are switched into the first or second state. In step 718 the remaining H-bridges are switched at a varied frequency between the first and second state.

The method illustrated in FIG. 7 may also be broken apart into separate methods. Steps 700, 702, 704, 706, and 708 could be one method. Steps 700, 702, 704, and 710 could be another method. Steps 700, 702, 704, 712, and 714 could be yet another method. Steps 700, 702, 704, 716, and 718 could be yet another method. Further methods could be made by combining any two or three of these four methods.

Figure 8:
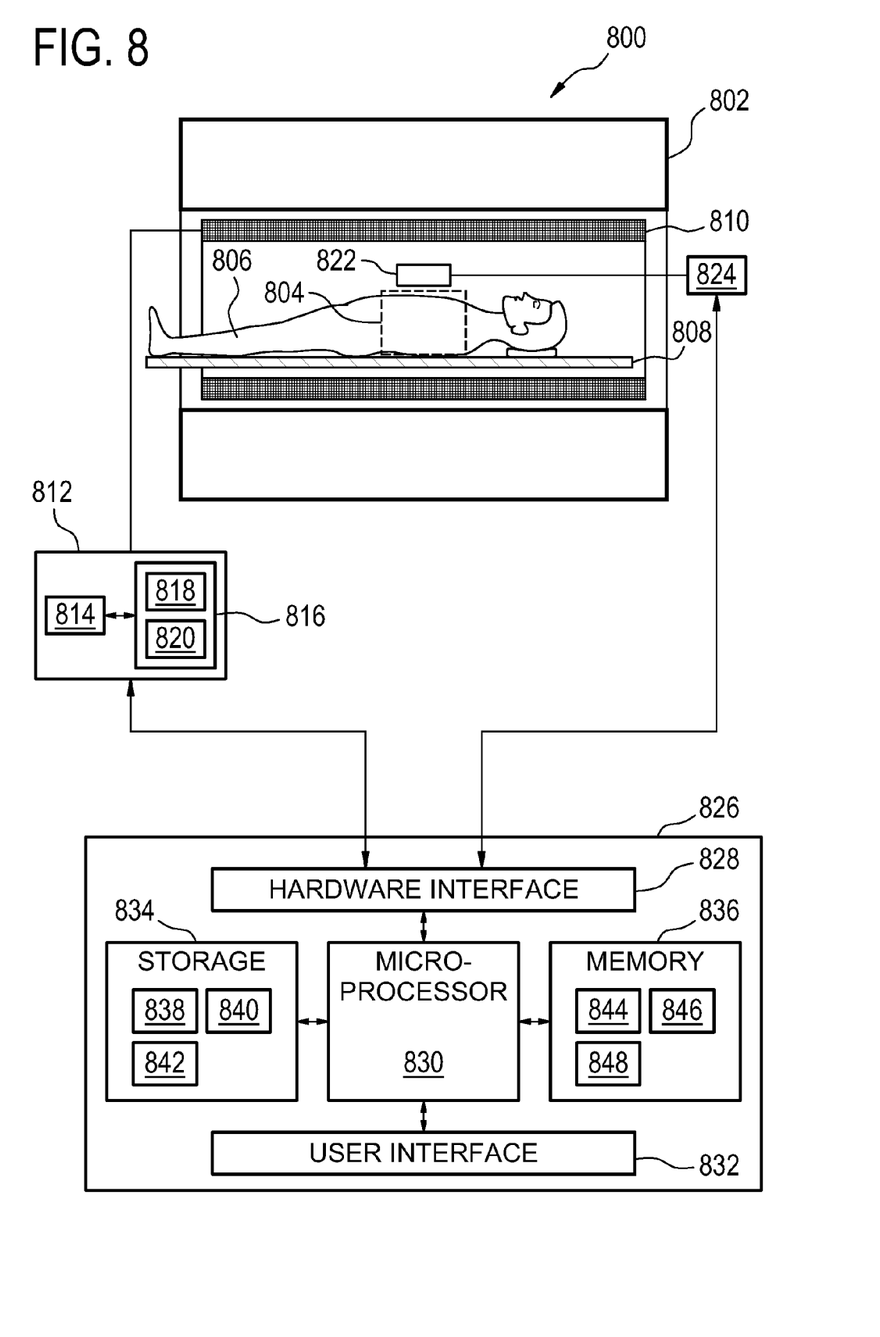
FIG. 8 shows a magnetic resonance imaging system according to an embodiment of the invention.

FIG. 8 shows a magnetic resonance imaging system 800 according to an embodiment of the invention. The magnetic resonance imaging system comprises a magnet 802. Magnet 802 has an imaging zone 804 to which the magnetic field is significantly homogeneous enough to perform magnetic resonance imaging. A subject 806 is shown as having a portion within the imaging zone 804. The subject 806 is resting on a subject support 808. The magnetic field gradient coil 810 is shown as being within the bore of the magnet 802. The gradient coil 810 is connected to a gradient coil power supply 812. The gradient coil power supply is shown as having a processor 814 which is able to control the operation of the H-bridge circuits. The H-bridge circuits are not shown in this illustration.

The gradient coil power supply 812 also comprises memory 816 which is accessible to the processor 814. In this example the memory contains a gradient coil pulse sequence 818 and a computer program product 820. The computer program product 820 has software modules which are able to interpret the gradient coil pulse sequence 818 and generate a switching plan. The switching plan may be generated and stored within the memory 816, it may also be stored within memory of the processor 814 or it may be generated on the fly. The switching plan may also be created on the fly and a current monitor may be used to monitor the current supplied to the magnetic field gradient coil 810. In this case the switching plan may be calculated or adapted dynamically.

Also shown is a radio frequency antenna 822. There may be a single antenna for both receiving and transmitting magnetic resonance imaging signals or there may be separate transmit and receive coils. The radio frequency antenna 822 is shown as being connected to a transceiver 824. There may be separate transmit and receive devices or a single transceiver 824 may be used.

The gradient coil power supply 812 and the transceiver 824 are shown as being connected to a hardware interface 828 of a computer system 826. In this case the computer system 826 controls the operation and function of the magnetic resonance imaging system. The computer 826 has a processor 830, computer storage 834, computer memory 836, and a user interface 832. The user interface 832 allows an operator to operate the magnetic resonance imaging system 800 and also for the magnetic resonance imaging system to display or to render magnetic resonance data.

The computer storage 834 may contain magnetic resonance data 838 that was acquired using the magnetic resonance imaging system 800. Also stored within the storage 834 may be one or more magnetic resonance images 840. These images are reconstructed from the magnetic resonance image data 838. Also stored within this storage 834 may be one or more pulse sequences 842. Pulse sequences are the instructions which are used to acquire magnetic resonance data 838. Within the memory 836 are instructions which are used for controlling the operation of the magnetic resonance imaging system. For example there may be a magnetic resonance system control module 844 which is used for controlling and operating the magnetic resonance imaging system 800. There may also be software for reconstructing the magnetic resonance image data 838 into magnetic resonance images 840. Image reconstruction module 846 is used for reconstructing the magnetic resonance images 840. There may also be software in the memory 836 which is used for controlling the gradient coil power supply 812. For example there may be a gradient coil power supply control module 848. The functions for controlling the operation of the gradient coil power supply 812 may be performed by either the processor in the gradient coil power supply 814 and/or the processor 830 in the computer 826.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 gradient coil power supply
102 connection to gradient coil
104 first H-bridge circuit
106 second H-bridge circuit
108 third H-bridge circuit
110 first output of first H-bridge circuit
112 second output of first H-bridge circuit
114 first output of second H-bridge circuit 116 second output of second H-bridge circuit
118 first output of third H-bridge circuit
120 second output of third H-bridge circuit
122 voltage supply
124 first switching unit
126 second switching unit
128 third switching unit
130 fourth switching unit
132 first output of first switching unit
134 second output of first switching unit
136 first output of second switching unit
138 second output of second switching unit
140 first output of third switching unit
142 second output of third switching unit
144 first output of fourth switching unit
146 second output of fourth switching unit
148 first output of voltage supply
150 second output of voltage supply
200 H-bridge circuit in first switching state
202 H-bridge circuit in second switching state
204 H-bridge circuit in third switching state
206 H-bridge circuit in fourth switching state
800 magnetic resonance imaging system
802 magnet
804 imaging zone
806 subject
808 subject support
810 magnetic field gradient coil
812 gradient coil power supply
814 processor
816 memory
818 gradient coil pulse sequence
820 computer program product
822 radio frequency antenna
824 transceiver
826 computer
828 hardware interface
830 processor
832 user interface
834 storage
836 memory
838 magnetic resonance data
840 magnetic resonance image
842 pulse sequence
844 magnetic resonance system control module
846 image reconstruction module
848 gradient coil power supply control module

The invention claimed is:

1. A gradient coil power supply for a magnetic resonance imaging system, the gradient coil power supply comprising:
at least two H-bridge circuits; wherein the H-bridge circuits are connected in series; wherein each of the H-bridge circuits supplies voltage of a first polarity when in a first switching state; wherein each H-bridge circuit supplies voltage of a second polarity when the H-bridge is in a second switching state; wherein each H-bridge circuit supplies no voltage when in a third switching state; wherein each H-bridge circuit supplies no voltage when in a fourth switching state; and wherein for a predetermined amount of time current is conducted through the H-bridge circuit in the third and fourth switching states, and
a controller for controlling the switching of the H-bridge circuits, wherein the controller is adapted for:
receiving a gradient pulse sequence,
creating a switching plan for controlling the switching of each of the H-bridge circuits, wherein the switching plan comprises controlling the voltage output of the gradient coil power supply by alternating between the first switching state and the second switching state, wherein the switching plan further comprises operating at least one H-bridge circuit selected from the H-bridge circuits in either the third or fourth switching state for part of the switching plan to cool the H-bridge circuit, and
executing the switching plan.

2. The gradient coil power supply of claim 1, wherein the switching plan further comprises switching at least one of the H-bridge circuits at a varied frequency between the first and second switching states.

3. The gradient coil power supply of claim 2, wherein the controller is further adapted for varying the frequency to minimize the switching losses in the H-bridge circuit and increases the maximum root mean square current able to be conducted by the H-bridge circuit.

4. The gradient coil power supply of claim 2, wherein the controller is further adapted for determining a minimum bandwidth for the gradient pulse sequence, and wherein the switching plan further comprises adjusting the varied frequency above a minimum threshold, wherein the minimum threshold is the minimum frequency to obtain the minimum bandwidth.

5. The gradient coil power supply of claim 2, wherein the pulse sequence specifies a time dependent current with a trapezoidal shape, wherein the trapezoidal shape specifies a time period where a constant current is specified, and wherein the switching plan further comprises reducing the varied frequency during the time period.

6. The gradient coil power supply of claim 1, wherein the switching plan further comprises fixing the H-bridge circuit in the first or second switching state for a period of time.

7. The gradient coil power supply of claim 1, wherein the switching plan further comprises setting at least one of the H-bridge circuits to either the first or second switching state for a fixed period of time, wherein the switching plan further comprises switching the remaining H-bridge circuits at a varied frequency between the first and second switching states, and wherein the fixed period of time is longer than the period of the varied frequency.

8. The gradient coil power supply of claim 1, wherein each H-bridge comprises a voltage supply, a first switching unit, a second switching unit, a third switching unit, and a fourth switching unit; wherein in the first switching state the first and fourth switching units are closed and the second and third switching units are open; wherein in the second switching state the second and third switching units are closed and the second and third switching units are open; wherein in the third switching state the third and fourth switching units are open and the first and second switching units are closed; and wherein in the fourth switching state the third and fourth switching units are closed and the first and second switching units are open.

9. The gradient coil power supply of claim 1, wherein the first, second, third, and fourth switching units are insulated-gate bipolar transistor switching units.

10. The gradient coil power supply of claim 9, wherein each of the H-bridge circuits has first and second outputs; wherein each switching unit has a first connection and a second connection; wherein the first connection of the first switching unit is connected to the first output of the H-bridge circuit; wherein the second connection of the first switching unit is connected to the first connection of the second switching unit; wherein the second connection of the second switching unit is connected to the second output of the H-bridge circuit; wherein the first connection of the third switching unit is connected to the first output of the H-bridge circuit; wherein the second connection of the third switching unit is connected to the first connection of the fourth switching unit; wherein the second connection of the fourth switching unit is connected to the second output of the H-bridge circuit; wherein each voltage supply comprises a first voltage output and a second voltage output; wherein the first voltage output is connected to the second connection of the first switching unit; and wherein the second voltage output is connected to the second output of the third switching unit.

11. A method of operating a gradient coil power supply for a magnetic resonance imaging system; wherein the gradient coil power supply comprises at least two H-bridge circuits; wherein the H-bridge circuits are connected in series; wherein the each H-bridge circuit supplies voltage of a first polarity when in a first switching state; wherein each H-bridge circuit supplies voltage of a second polarity when the H-bridge is in a second switching state; wherein each H-bridge circuit supplies no voltage when in a third switching state; wherein each H-bridge circuit supplies no voltage when in a fourth switching state; wherein for a predetermined amount of time current is conducted through the H-bridge circuit in the third and fourth switching states, and wherein the method comprises:
   receiving a gradient pulse sequence,
   creating a switching plan for controlling the switching of the switching units in each of the H-bridge circuits, wherein the switching plan comprises controlling the voltage output of the gradient coil power supply by alternating between the first switching state and the second switching state, wherein the switching plan further comprises operating at least one H-bridge circuit selected from the H-bridge circuits in either the third or fourth switching state for part of the switching plan to cool the H-bridge circuit, and
   executing the switching plan.

12. The method of claim 11, wherein the switching plan further comprises switching at least one of the H-bridge circuits at a varied frequency between the first and second switching states.

13. A computer program product comprising machine executable instructions for execution by a processor of a control unit of a gradient coil power supply for a magnetic resonance imaging system; wherein the gradient coil power supply comprises at least two H-bridge circuits; wherein the H-bridge circuits are connected in series; wherein each H-bridge circuit supplies voltage of a first polarity when in a first switching state; wherein the each H-bridge circuit supplies voltage of a second polarity when the H-bridge is in a second switching state; wherein each H-bridge circuit supplies no voltage when in a third switching state; wherein each H-bridge circuit supplies no voltage when in a fourth switching state; wherein for a predetermined amount of time current is conducted through the H-bridge circuit in the third and fourth switching states, and wherein the machine executable instructions cause the processor to perform the steps of:
   receiving a gradient pulse sequence,
   creating a switching plan for controlling the switching of the switching units in each of the H-bridge circuits, wherein the switching plan comprises controlling the voltage output of the gradient coil power supply by alternating between the first switching state and the second switching state, wherein the switching plan further comprises operating at least one H-bridge circuit selected from the H-bridge circuits in either the third or fourth switching state for part of the switching plan to cool the H-bridge circuit, and
   executing the switching plan.

14. A magnetic resonance imaging system, comprising:
   a magnetic resonance imaging magnet;
   a magnetic field gradient coil;
   a radio frequency system for acquiring magnetic resonance data, wherein the radio frequency system is adapted to connect to a radio frequency antenna;
   a gradient coil power supply comprising:
      at least two H-bridge circuits; wherein the H-bridge circuits are connected in series; wherein each of the H-bridge circuits supplies voltage of a first polarity when in a first switching state; wherein each H-bridge circuit supplies voltage of a second polarity when the H-bridge is in a second switching state; wherein each H-bridge circuit supplies no voltage when in a third switching state; wherein each H-bridge circuit supplies no voltage when in a fourth switching state; and wherein for a predetermined amount of time current is conducted through the H-bridge circuit in the third and fourth switching states, and
      a controller for controlling the switching of the H-bridge circuits, wherein the controller is adapted for:
         receiving a gradient pulse sequence,
         creating a switching plan for controlling the switching of each of the H-bridge circuits, wherein the switching plan comprises controlling the voltage output of the gradient coil power supply by alternating between the first switching state and the second switching state, wherein the switching plan further comprises operating at least one H-bridge circuit selected from the H-bridge circuits in either the third or fourth switching state for part of the switching plan to cool the H-bridge circuit, and
         executing the switching plan,
   wherein the gradient coil power supply is adapted for supplying current to the magnetic field gradient coil; and
   a computer system adapted for constructing images from magnetic resonance data and for controlling the operation of the magnetic resonance imaging system.

* * * * *